(12) United States Patent
Gwon et al.

(10) Patent No.: US 11,462,597 B2
(45) Date of Patent: *Oct. 4, 2022

(54) ORGANIC LIGHT-EMITTING DISPLAY DEVICE HAVING TOUCH SENSOR

(71) Applicant: LG Display Co., Ltd., Seoul (KR)

(72) Inventors: Hyang-Myoung Gwon, Paju-si (KR); Ji-Hyun Jung, Paju-si (KR); Deuk-Su Lee, Goyang-si (KR); Su-Chang An, Seoul (KR); Jae-Gyun Lee, Paju-si (KR); Ru-Da Rhe, Seoul (KR); Yang-Sik Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/385,432

(22) Filed: Jul. 26, 2021

(65) Prior Publication Data

US 2021/0351240 A1 Nov. 11, 2021

Related U.S. Application Data

(63) Continuation of application No. 16/387,765, filed on Apr. 18, 2019, now Pat. No. 11,114,510.

(30) Foreign Application Priority Data

Apr. 18, 2018 (KR) .................. 10-2018-0044955

(51) Int. Cl.
*H01L 27/32* (2006.01)
*H01L 51/00* (2006.01)
(Continued)

(52) U.S. Cl.
CPC ............ *H01L 27/323* (2013.01); *G06F 3/044* (2013.01); *H01L 27/322* (2013.01);
(Continued)

(58) Field of Classification Search
CPC ....... G06F 2203/04111; G06F 3/04164; G06F 3/0446; G06F 3/0412; G06F 3/041; G06F 3/044
See application file for complete search history.

(56) References Cited

U.S. PATENT DOCUMENTS

2010/0253646 A1   10/2010   Hiratsuka
2014/0300833 A1   10/2014   Yang
(Continued)

FOREIGN PATENT DOCUMENTS

KR   10-2012-0080930 A    7/1820
KR        2017-16655 A    1/2017
KR   10-2017-0106621 A    9/2017

*Primary Examiner* — Md Saiful A Siddiqui

(74) *Attorney, Agent, or Firm* — Birch, Stewart, Kolasch & Birch, LLP

(57) ABSTRACT

An organic light-emitting display device can include a light-emitting element on a substrate; an encapsulation unit on the light-emitting element and including first and second inorganic encapsulation films, and an organic encapsulation film; a touch insulating film on the second inorganic encapsulation film; a touch sensor including first and second touch electrodes; a routing line; a touch pad; and a plurality of connection electrodes electrically connecting the routing line with the touch pad, in which the first touch electrodes are connected via first bridges, the second touch electrodes are connected via second bridges, and the first and second bridges and the first and second touch electrodes are formed of a same material as each other in a same plane.

15 Claims, 14 Drawing Sheets

(51) Int. Cl.
*G06F 3/044* (2006.01)
*H01L 51/52* (2006.01)

(52) U.S. Cl.
CPC ...... *H01L 27/3276* (2013.01); *H01L 51/0097* (2013.01); *H01L 51/5253* (2013.01); *H01L 51/5284* (2013.01); *H01L 2251/5338* (2013.01)

(56) References Cited

U.S. PATENT DOCUMENTS

| | | |
|---|---|---|
| 2017/0068363 A1 | 3/2017 | Lo et al. |
| 2017/0262109 A1 | 9/2017 | Choi et al. |
| 2018/0040672 A1* | 2/2018 | Park ................. G06F 1/1652 |
| 2018/0061898 A1 | 3/2018 | Oh et al. |
| 2018/0061899 A1 | 3/2018 | Oh et al. |
| 2018/0095566 A1 | 4/2018 | Lee et al. |
| 2018/0095584 A1 | 4/2018 | Lee et al. |
| 2018/0113545 A1 | 4/2018 | Shim et al. |
| 2019/0165048 A1* | 5/2019 | Kim ................. H01L 51/0097 |

* cited by examiner

ORGANIC LIGHT-EMITTING DISPLAY DEVICE HAVING TOUCH SENSOR

CROSS-REFERENCE TO RELATED APPLICATION

This application is a Continuation of U.S. patent application Ser. No. 16/387,765, filed on Apr. 18, 2019, which claims the priority benefit of Korean Patent Application No. 10-2018-0044955, filed on Apr. 18, 2018, the entire contents of all of these applications being hereby incorporated by reference as if fully set forth into the present application.

BACKGROUND OF THE INVENTION

Field of the Invention

The present invention relates to a display device, and more particularly to an organic light-emitting display device having a touch sensor that can achieve structural simplification and cost reduction.

Discussion of the Related Art

A touchscreen is an input device through which a user can input a command by selecting instructions displayed on a screen of a display device using a hand or an object. To accomplish this, the touchscreen converts a contact position that directly contacts a human hand or an object into an electrical signal and receives selected instructions from the contact position as an input signal. Such a touchscreen can substitute for a separate input device that is connected to a display device and operated, such as a keyboard or a mouse, and thus the range of application of the touchscreen has gradually increased.

In general, a touchscreen is attached to the front surface of a display panel, such as a liquid crystal display panel or an organic electroluminescent display panel, using an adhesive. In this case, since the touchscreen is separately manufactured and then attached to the front surface of the display panel, an additional attachment process is carried out, and thus the overall process becomes complicated and manufacturing costs are increased.

SUMMARY OF THE INVENTION

Accordingly, the present invention is directed to an organic light-emitting display device having a touch sensor that substantially obviates one or more problems due to limitations and disadvantages of the related art.

An object of the present invention is to provide an organic light-emitting display device having a touch sensor that can achieve structural simplification and cost reduction.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, an organic light-emitting display device includes a touch sensor formed in a single-layer structure and disposed on a touch insulating film overlapping an encapsulation unit disposed on a light-emitting element, wherein first and second bridges and first and second touch electrodes included in the touch sensor having a single-layer structure are formed of the same material as each other in the same plane, the first and second bridges and the first and second touch electrodes being disposed on the touch insulating film, thereby simplifying the structure thereof and reducing costs.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Reference will now be made in detail to exemplary embodiments of the present invention, examples of which are illustrated in the accompanying drawings. Wherever possible, the same reference numbers will be used throughout the drawings to refer to the same or like parts.

Figure 1:
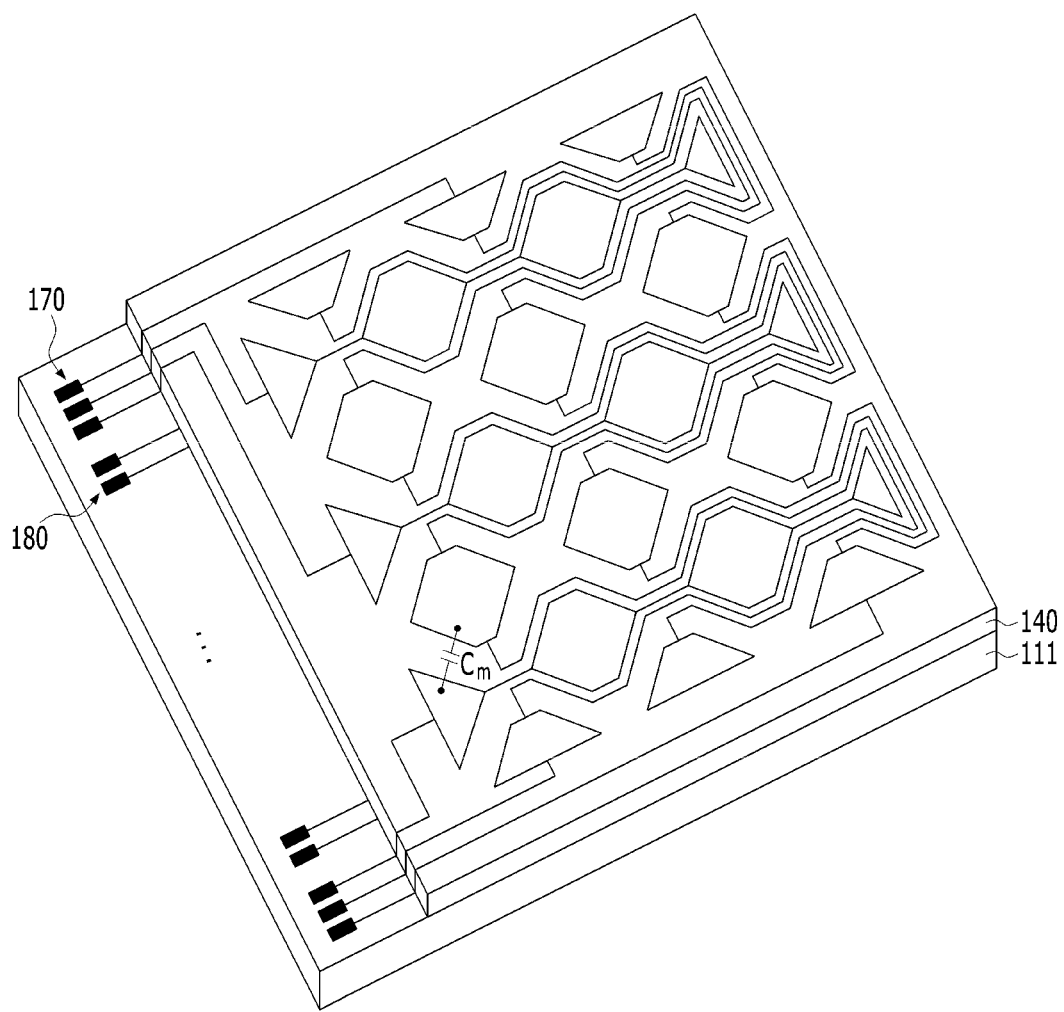
FIG. 1 is a perspective view showing an organic light-emitting display device having a touch sensor according to a first embodiment of the present invention.
Figure 2:
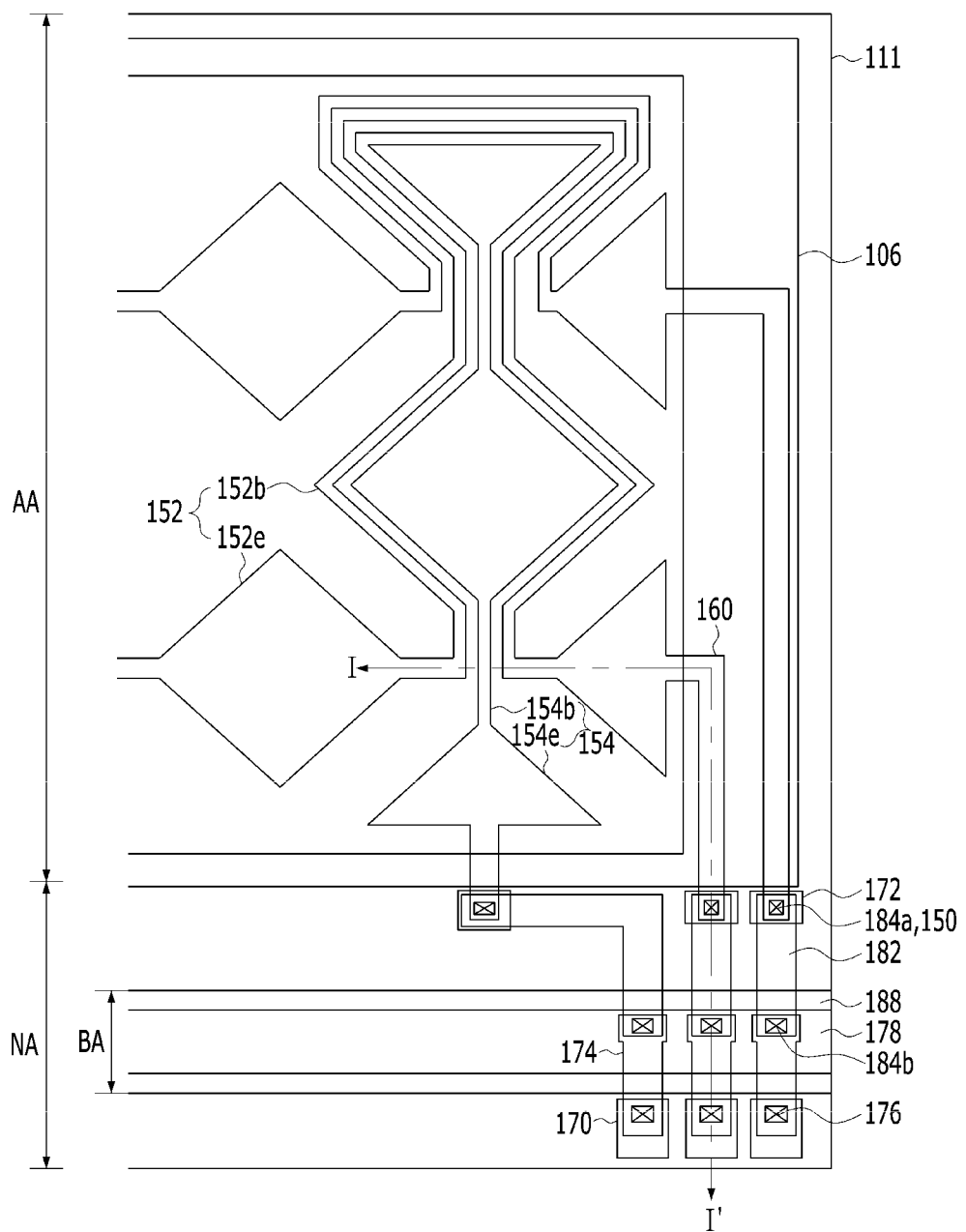
FIG. 2 is a plan view showing the organic light-emitting display device having the touch sensor shown in FIG. 1.
Figure 3:
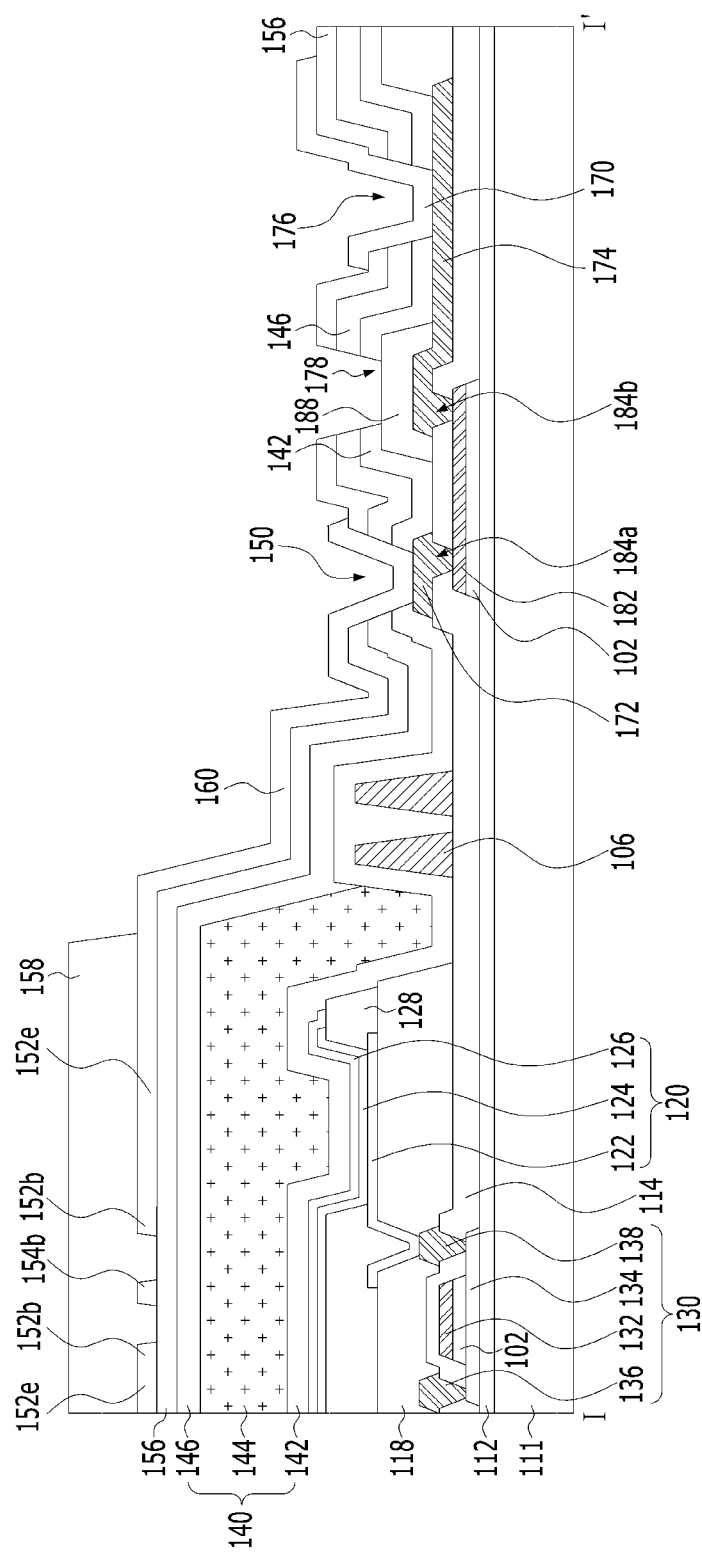
FIG. 3 is a cross-sectional view taken along line I-I' in FIG. 2.
Figure 4:
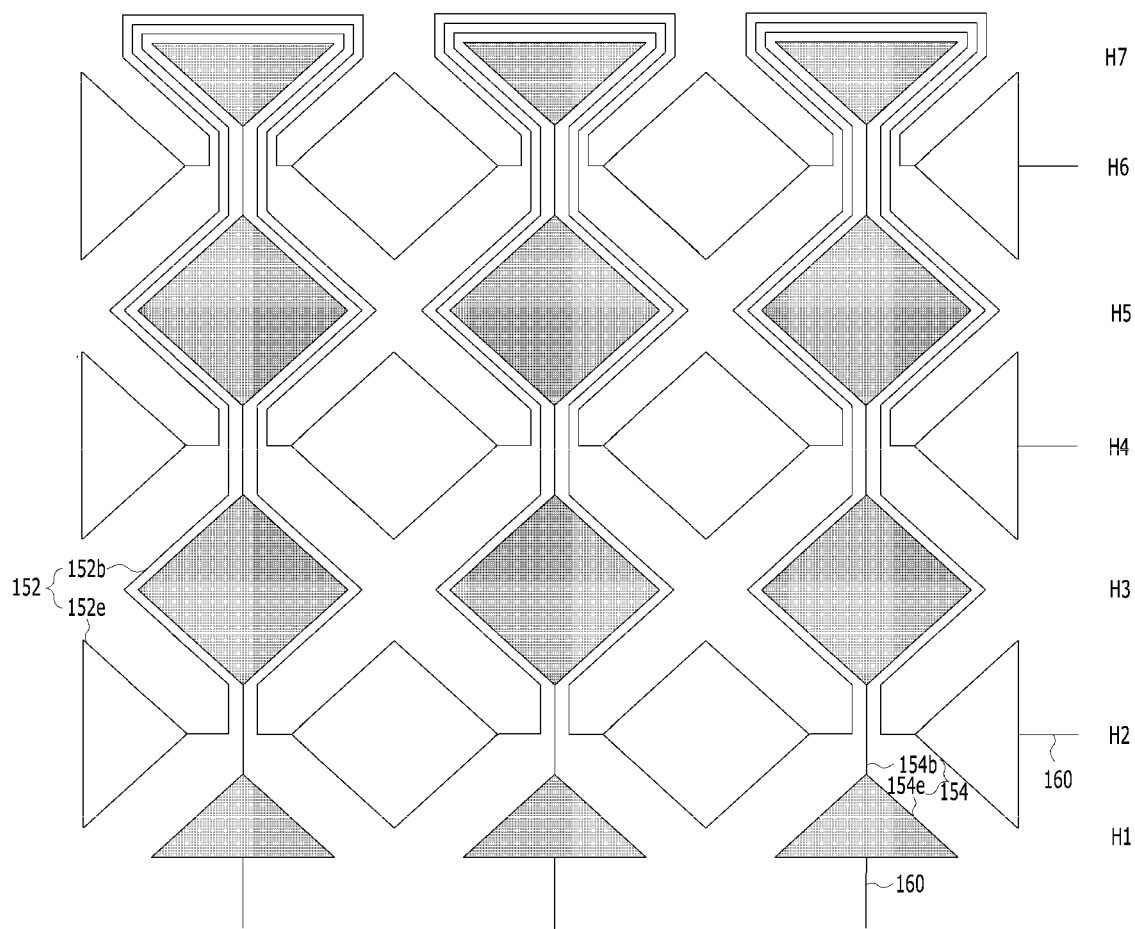
FIG. 4 is a plan view showing the first bridge extending in a convoluted form shown in FIG. 2 in detail.

FIG. 1 is a perspective view showing an organic light-emitting display device having a touch sensor according to a first embodiment of the present invention. FIG. 2 is a plan view showing the organic light-emitting display device having the touch sensor shown in FIG. 1. FIG. 3 is a cross-sectional view taken along line I-I' in FIG. 2, and FIG. 4 is a plan view showing the first bridge extending in a convoluted form shown in FIG. 2 in detail. All the components of the organic light-emitting display device having the touch sensor according to all embodiments and examples of the present invention are operatively coupled and configured.

The organic light-emitting display device having a touch sensor shown in FIG. 1 includes a plurality of sub-pixels arranged in a matrix form on a substrate 111, an encapsulation unit 140 disposed on the sub-pixels, and a mutual capacitance Cm disposed on the encapsulation unit 140.

The organic light-emitting display device having a touch sensor has, as shown in FIG. 2, an active area AA disposed on the substrate 111 and a non-active area NA disposed adjacent to the active area AA. The substrate 111 is formed of a flexible material such as plastic or glass so as to be bendable. For example, the substrate is formed of polyimide (PI), polyethylene terephthalate (PET), polyethylene naphthalate (PEN), polycarbonate (PC), polyethersulfone (PES), polyacrylate (PAR), polysulfone (PSF), or cyclic-olefin copolymer (COC).

The active area AA displays an image through unit pixels arranged in a matrix form. Each unit pixel includes red, green and blue sub-pixels, or includes red, green, blue, and white sub-pixels, but it is possible to have different combinations.

Each of the sub-pixels includes, as shown in FIG. 3, a pixel-driving circuit including a driving thin-film transistor 130, and a light-emitting element 120 connected to the pixel-driving circuit.

The driving thin-film transistor 130 controls current supplied from a high-voltage supply line to the light-emitting element 120 in response to a data signal supplied to a gate electrode of the driving thin-film transistor 130, thus adjusting the amount of light emitted from the light-emitting element 120.

Such a driving thin-film transistor 130 includes a semiconductor layer 134 disposed on a buffer layer 112, a gate electrode 132 overlapping the semiconductor layer 134 with a gate insulating film 102 interposed therebetween, and source and drain electrodes 136 and 138 formed on an interlayer insulating film 114 and contacting the semiconductor layer 134. Here, the semiconductor layer 134 is formed of at least one of an amorphous semiconductor material, a polycrystalline semiconductor material, or an oxide semiconductor material.

The light-emitting element 120 includes an anode 122, at least one light-emitting stack 124 formed on the anode 122, and a cathode 126 formed on the light-emitting stack 124.

The anode 122 is electrically connected to the drain electrode 138 of the driving thin-film transistor 130, which is exposed through a pixel contact hole penetrating a pixel planarization layer 118. An inorganic protective layer as well as the pixel planarization layer 118 can be disposed between the anode 122 and a driving transistor T2.

The at least one light-emitting stack 124 is formed on the anode 122 in the emission area provided by a bank 128. The light-emitting stack 124 is formed by stacking, on the anode 122, a hole-related layer, an organic light-emitting layer, and an electron-related layer, either in this order or in the reverse order. In addition, the light-emitting stack 124 can include first and second light-emitting stacks, which face each other with a charge generation layer interposed therebetween. In this case, an organic light-emitting layer of any one of the first and second light-emitting stacks generates blue light, and an organic light-emitting layer of the remaining one of the first and second light-emitting stacks generates yellow-green light, with the result that white light is generated via the first and second light-emitting stacks. The white light generated from the light-emitting stack 124 is incident on a color filter disposed on or under the light-emitting stack 124, thus generating a color image. Alternatively, it is possible to generate a color image in a manner such that each light-emitting stack 124 generates colored light corresponding to each sub-pixel without a separate color filter. That is, a light-emitting stack 124 of a red sub-pixel may generate red light, a light-emitting stack 124 of a green sub-pixel can generate green light, and a light-emitting stack 124 of a blue sub-pixel can generate blue light.

The cathode 126 is formed so as to face the anode 122 with the light-emitting stack 124 interposed therebetween and is connected to a low-voltage supply line.

The encapsulation unit 140 prevents external moisture or oxygen from entering the light-emitting element 120, which is vulnerable to external moisture or oxygen. To this end, the encapsulation unit 140 includes at least one inorganic encapsulation layer 142 and at least one organic encapsulation layer 144. In the present invention, the structure of the encapsulation unit 140 in which a first inorganic encapsulation layer 142, an organic encapsulation layer 144 and a second inorganic encapsulation layer 146 are sequentially stacked will be described by way of example.

The first inorganic encapsulation layer 142 is formed on the substrate 111, on which the cathode 126 has been formed. The second inorganic encapsulation layer 146 is formed on the substrate 111, on which the organic encapsulation layer 144 has been formed, and covers the upper surface, the lower surface and the lateral surfaces of the organic encapsulation layer 144 together with the first inorganic encapsulation layer 142.

The first and second inorganic encapsulation layers 142 and 146 minimize or prevent permeation of external moisture or oxygen into the light-emitting stack 124. The first and second inorganic encapsulation layers 142 and 146 are formed of a material having the same or similar etching characteristics as that of a touch insulating film 156, whereby a pad contact hole 176, a trench 178 and a routing contact hole 150 can be formed through a single etching process. For example, the first and second inorganic encapsulation layers 142 and 146 are formed of an inorganic insulating material, such as silicon nitride (SiNx), silicon oxide (SiOx), silicon oxide nitride (SiON), or aluminum oxide ($Al_2O_3$). Accordingly, the first and second inorganic encapsulation layer 142 and 146 are deposited in a low-temperature atmosphere, thereby preventing damage to the light-emitting stack 124, which is vulnerable to a high-temperature atmosphere, during a process of depositing the first and second inorganic encapsulation layers 142 and 146.

The organic encapsulation layer 144 serves as a buffer to dampen stress between respective layers according to bending of the organic light-emitting display device and enhances the planarization performance of the organic light-emitting display device. The organic encapsulation layer 144 is formed on the substrate 111, on which the first inorganic encapsulation layer 142 is formed, using a non-photosensitive organic insulating material, such as PCL, acrylic resin, epoxy resin, polyimide, polyethylene or silicon oxycarbide (SiOC), or using a photosensitive organic insulating material such as photo acrylic. The organic encapsulation layer 144 is disposed in the active area AA so as to expose the non-active area NA. If the organic encapsulation layer 144 is formed through an inkjet method, a plurality of dams 106 is formed so as to be disposed parallel to each other between the non-active area NA and the active area AA and to surround the active area AA. The dams 106 serve to prevent the organic encapsulation layer 144 in a liquid state from invading the non-active area NA, in which a touch pad 170 and a display pad 180 are disposed, when the organic encapsulation layer 144 in the liquid state drops onto the active area AA. Each of the dams 106 is formed to have a single-layer or multi-layer structure. For example, each of the dams 106 is formed of the same material as at least one of the bank 128 or a spacer and is formed simultaneously therewith, and thus no additional mask process can be required and a cost increase can be prevented.

A touch insulating film 156 is disposed on the second inorganic encapsulation layer 146 of the encapsulation unit 140, and touch-sensing lines 154 and touch-driving lines 152 are disposed on the touch insulating film 156. A mutual capacitance Cm is formed between the touch-sensing lines 154 and the touch-driving lines 152. The mutual capacitance Cm performs a charging operation using a touch driving pulse supplied to the touch-driving lines 152 and discharges the charged charge to the touch-sensing lines 154, thereby serving as a touch sensor.

The organic light-emitting display device having the touch sensor displays an image through a plurality of sub-pixels, each including the light-emitting element 120, during the display operation. In addition, during the touch operation, the organic light-emitting display device having the touch sensor senses the amount of change of the mutual capacitance Cm (the touch sensor) caused by a user touch, thereby sensing whether there is a touch and the touch position.

Each of the touch-driving lines 152 included in the touch sensor includes a plurality of first touch electrodes 152e and first bridges 152b to electrically connect the first touch electrodes 152e.

The first touch electrodes 152e are spaced apart from each other at regular intervals in the X-axis direction (the row direction), which is the first direction, on the touch insulating film 156. Each of the first touch electrodes 152e is electrically connected to an adjacent first touch electrode 152e via a corresponding one of the first bridges 152b.

The first bridges 152b are disposed in the spaces between the first and second touch electrodes 152e and 154e and in the spaces between the first touch electrodes 152e and the second bridges 154b on the touch insulating film 156, on which the first touch electrodes 152e are also disposed. Further, since the first bridges 152b are formed through the same mask process as the first touch electrodes 152e, the first bridges 152b are formed integrally with the first touch electrodes 152e without separate contact holes. The first bridges 152b are coplanar with the first touch electrodes 152e, the second touch electrodes 154e and the second bridges 154b and are formed of the same material. Thus, the touch sensor of the present invention is formed in a single-layer structure.

To this end, the first bridges 152b are disposed so as to extend along the second touch electrodes 154e and the second bridges 154b in a convoluted form and are electri-cally connected to the first touch electrodes 152e and the first bridges 152b, which are adjacent thereto in the first direction.

Specifically, as shown in FIG. 4, the first touch electrodes 152e disposed in the second row H2 are connected to each other via the first bridges 152b, which extend in a convoluted form along the second touch electrodes 154e and the second bridges 154b that are disposed in the third row H3 to the $n^{th}$ row Hn (e.g., H7), where n is a natural number greater than i and represents the last row of the touch sensor. The first touch electrodes 152e disposed in the fourth row H4 are connected to each other via the first bridges 152b, which extend in a convoluted form along the second touch electrodes 154e and the second bridges 154b that are disposed in the fifth row H5 to the $n^{th}$ row Hn (e.g., H7). That is, the first touch electrodes 152e disposed in the $i^{th}$ row Hi (where i is a natural number) are connected to each other via the first bridges 152b, which extend in a convoluted form along the second touch electrodes 154e and the second bridges 154b that are disposed in the i+1$^{th}$ row Hi+1 to the $n^{th}$ row Hn.

Each of the touch-sensing lines 154 includes a plurality of second touch electrodes 154e and second bridges 154b to electrically connect the second touch electrodes 154e.

The second touch electrodes 154e are spaced apart from each other at regular intervals in the Y-axis direction (the column direction), which is the second direction, on the touch insulating film 156, on which the first touch electrodes 152e and the first bridges 152b are also disposed. Each of the second touch electrodes 154e is electrically connected to the adjacent second touch electrode 154e via a corresponding one of the second bridges 154b.

The second bridges 154b are electrically connected to the second touch electrodes 154e and the second bridges 154b that are adjacent thereto in the second direction on the second inorganic encapsulation layer 146, on which the first touch electrodes 152e, the first bridges 152b and the second touch electrodes 154e are also disposed. Since the second bridges 154b are formed through the same mask process as the second touch electrodes 154e, the second bridges 154b are formed integrally with the second touch electrodes 154e without separate contact holes. The second bridges 154b are disposed between the first bridges 152b, and the first bridges 152b are disposed to be symmetrical in the lateral direction with respect to the second bridges 154b.

As described above, according to the present invention, the first and second touch electrodes 152e and 154e and the first and second bridges 152b and 154b are coplanar with each other, e.g., are disposed on the touch insulating film 156, and are formed of the same material as each other, thereby simplifying the structure and the processing thereof. For example, the first and second touch electrodes 152e and 154e and the first and second bridges 152b and 154b are implemented as transparent conductive films, such as ITO, IZO, IGZO or silver nanowire (AgNW), so that light generated from the light-emitting element is emitted outside.

A display pad 180 and a touch pad 170, which are connected to signal lines for driving the driving thin-film transistor 130 and the light-emitting element 120, are disposed in the non-active area NA. The display pad 180 and the touch pad 170 can be disposed in the non-active area NA located on at least one of one side or the opposite side of the substrate 111, or can be disposed in different non-active areas NA from each other. The structures of the touch pad 170 and the display pad 180 are not limited to the structures shown in FIG. 1, but can be variously changed depending on the design choices made for the display device.

The touch pad 170 and the display pad 180 are disposed on the touch insulating film 156 on the substrate 111, which is exposed by the encapsulation unit 140. The touch pad 170 is formed so as to be exposed together with a routing line 160 by the touch protective film 158, and is thus connected to a signal transmission film, on which a touch-driving unit is installed. The touch protective film 158 is formed to cover the touch-sensing lines 154 and the touch-driving lines 152, thus preventing the touch-sensing lines 154 and the touch-driving lines 152 from corroding due to external moisture or the like. The touch protective film 158 is formed in a film or thin-film configuration using an organic insulating material such as epoxy or acrylic, or is formed of an inorganic insulating material such as SiNx or SiOx.

The touch pad 170 is formed of the same material as the first and second touch electrodes 152e and 154e, the first and second bridges 152b and 154b and the routing line 160.

The touch pad 170 is connected to the routing line 160, which is disposed on the lateral surface of the encapsulation unit 140 via a lower connection electrode 182 and first and second upper connection electrodes 172 and 174.

The lower connection electrode 182 is disposed on the gate insulating film 102 in the same pattern as the gate insulating film 102. This lower connection electrode 182 is formed together with the gate electrode 132 and is formed of the same material.

The first upper connection electrode 172 electrically connects the lower connection electrode 182 and the routing line 160 to each other. The first upper connection electrode 172 is connected to the lower connection electrode 182, which is exposed through a first connection contact hole 184a that penetrates the interlayer insulating film 114. The first upper connection electrode 172 is exposed through the routing contact hole 150, which penetrates the first and second inorganic encapsulation layers 142 and 146 and the touch insulating film 156 and is connected to the routing line 160. The first upper connection electrode 172 is formed together with the source and drain electrodes 136 and 138 and is formed of the same material.

The second upper connection electrode 174 electrically connects the lower connection electrode 182 and the touch pad 170 to each other. The second upper connection electrode 174 is electrically connected to the lower connection electrode 182, which is exposed through a second connection contact hole 184b, which penetrates the interlayer insulating film 114. The second upper connection electrode 174 is exposed through the pad contact hole 176, which penetrates the first and second encapsulation layers 142 and 146 and the touch insulating film 156 and is electrically connected to the touch pad 170. The second upper connection electrode 174 is formed together with the source and drain electrodes 136 and 138 and is formed of the same material.

The non-active area NA, in which the touch pad 170 and the display pad 180 are disposed, includes a bending area BA, in which the substrate 111 is bendable or foldable. The bending area BA corresponds to the area that is bent in order to place the non-display area such as the touch pad 170 and the display pad 180 on the rear surface of the active area AA. As shown in FIG. 2, this bending area BA is disposed within the upper side of the non-active area NA, which corresponds to a region between each of the touch pad 170 and the display pad 180 and the active area AA. Alternatively, the bending area BA can be disposed within at least one of the upper side, the lower side, the left side or the right side of the non-active area NA. Accordingly, the area occupied by the active area AA is maximized and the area corresponding to the non-active area NA is minimized on the entire screen of the display device.

As shown in FIG. 2, the connection electrodes 182, 172 and 174 connecting the routing line 160 and the touch pad 170 to each other are disposed in the bending area BA across the bending area BA. As shown in FIG. 3, a crack prevention layer 188 and at least one trench 178 are disposed in the bending area BA so that the bending area BA is easily bent.

The crack prevention layer 188 is formed of an organic insulating material having greater strain and higher impact resistance than the inorganic insulating film. For example, since the crack prevention layer 188 is formed together with at least one of the planarization layer 118 or the bank 128 (in order to form a single mask), the crack prevention layer 188 is coplanar with at least one of the planarization layer 118 or the bank 128 and is formed of the same material. The crack prevention layer 188 formed of an organic insulating material has greater strain than the inorganic insulating material and thus alleviates bending stress caused by bending of the substrate 111. Accordingly, the crack prevention layer 188 is capable of preventing cracking of the bending area BA, thus preventing cracks from spreading to the active area AA. In addition, the crack prevention layer 188 is capable of preventing bending stress from being applied to the thin films 112, 102 and 114 formed of an inorganic insulating material and the lower connection electrode 182 and the upper connection electrodes 172 and 174 formed of a conductive material, which are disposed in the bending area BA. In particular, since the crack prevention layer 188 is disposed on the lower connection electrode 182 and on the first and second upper connection electrodes 172 and 174, the lower connection electrode 182 and the first and second upper connection electrodes 172 and 174 are prevented from cracking in the bending area BA. As a result, the connection stability of the touch pad 170 and the routing line 160 via the lower connection electrode 182 and the upper connection electrodes 172 and 174 is improved.

The trench 178 is formed by removing the inorganic insulating films, which have higher hardness than an organic insulating material and thus easily crack due to bending stress. For example, the trench 178 is formed by removing the first and second inorganic encapsulation layers 142 and 146 and the touch insulating film 156, which are inorganic insulating layers disposed on the crack prevention layer 188. The trench 178 disposed in the bending area BA is formed through the same mask process as the routing contact hole 150 and the pad contact hole 176, thereby simplifying the structure and the processing thereof.

As described above, according to the present invention, the first and second touch electrodes 152e and 154e and the first and second bridges 152b and 154b are formed to be disposed in the same plane and are formed of the same material as each other. Thus, according to the present invention, the first and second touch electrodes 152e and 154e and the first and second bridges 152b and 154b are formed together through a single mask process, thereby simplifying the structure and the processing thereof. In addition, the conventional organic light-emitting display device is constructed such that a touch screen is attached to an organic light-emitting display device using an adhesive, whereas the organic light-emitting display device according to the present invention is constructed such that the touch electrodes 152e and 154e are disposed on the encapsulation unit 140 and thus does not require a separate adhesion process, thereby simplifying the processing thereof and reducing costs. In addition, the present invention is capable of preventing cracking using the trench 178 and the crack prevention layer 188 disposed in the bending area BA. Accordingly, the present invention is capable of preventing cracks from spreading to the active area AA, thus preventing the occurrence of defects in the lines and malfunction of the device.

Figure 5:
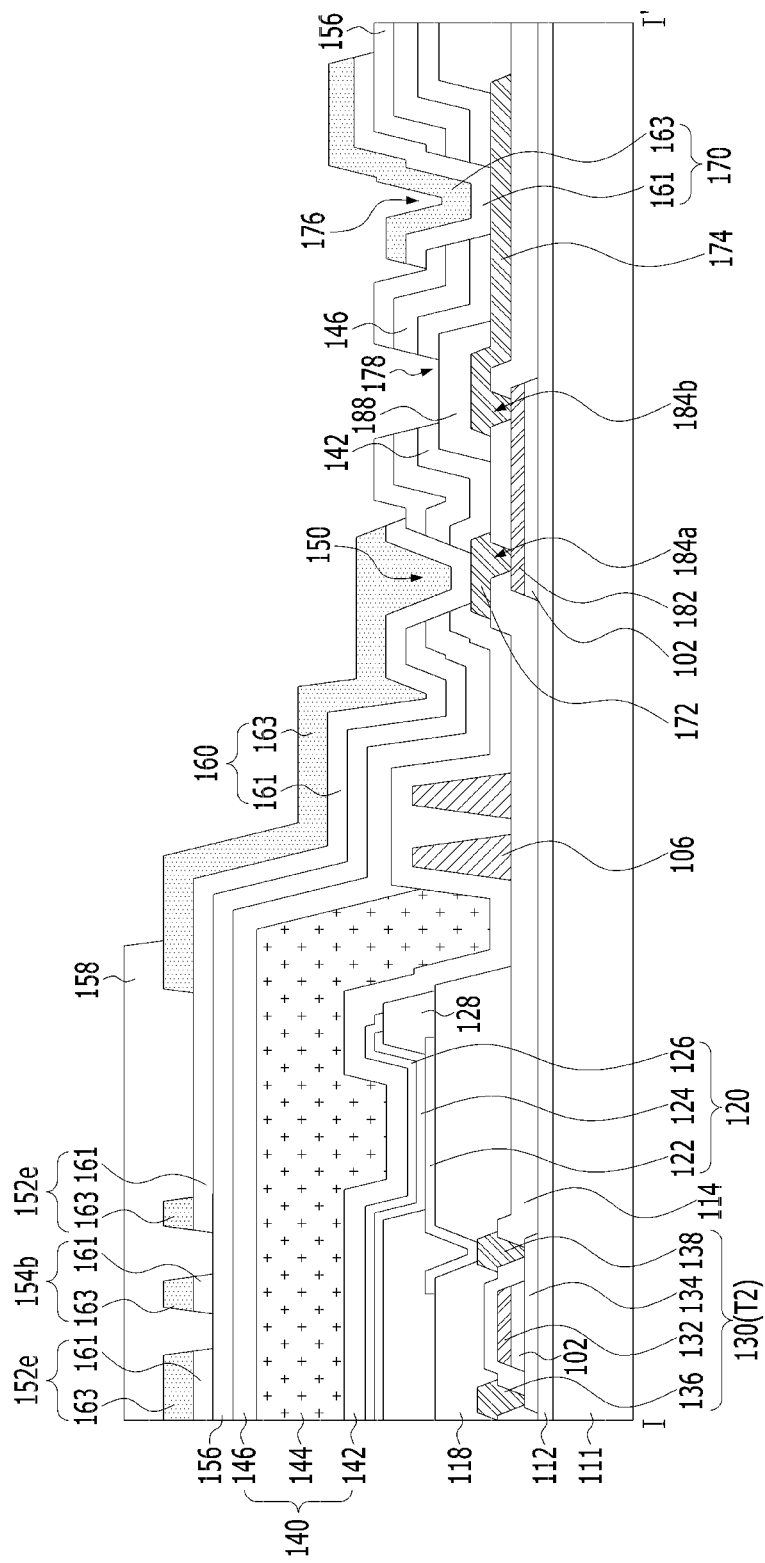
FIG. 5 is a cross-sectional view showing an organic light-emitting display device having a touch sensor according to a second embodiment of the present invention.
Figure 6:
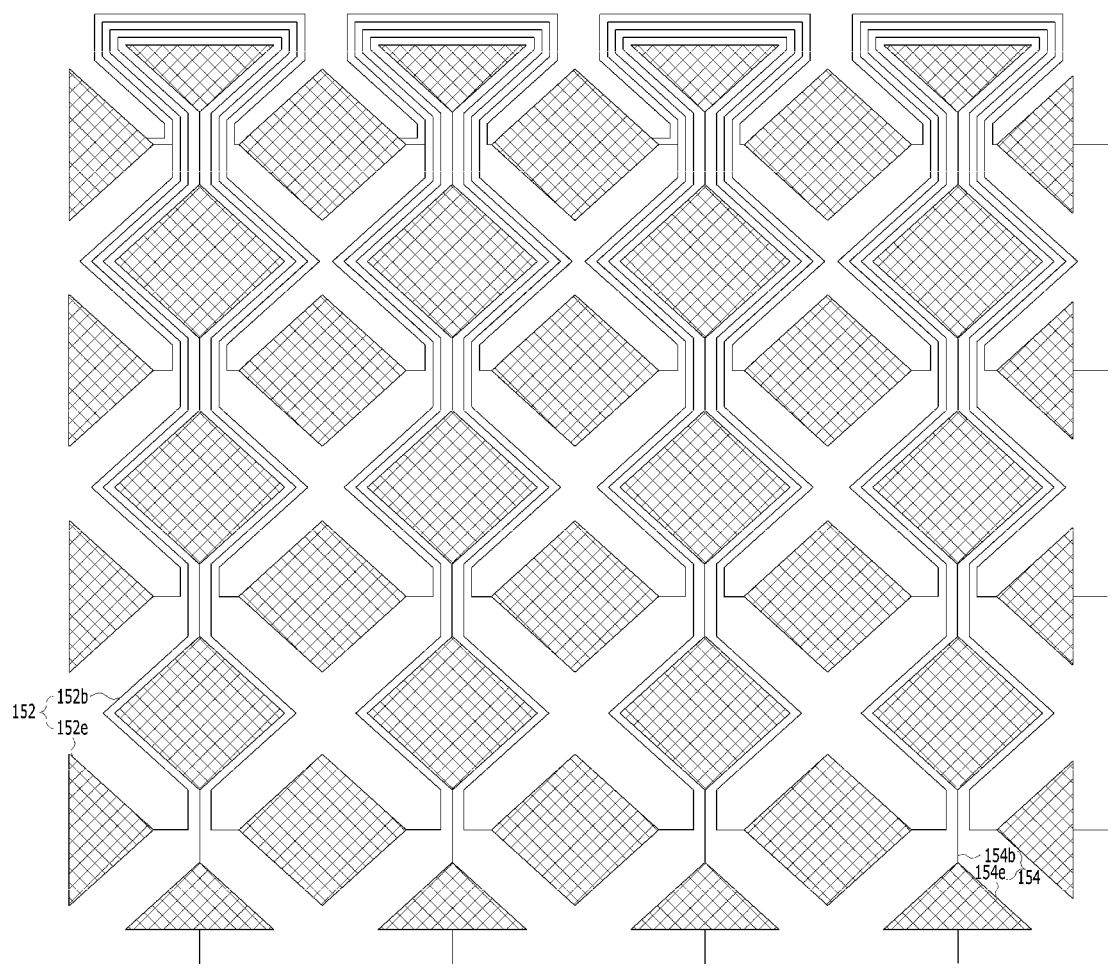
FIG. 6 is a plan view showing the first and second touch electrodes shown in FIG. 5.

FIG. 5 is a cross-sectional view showing an organic light-emitting display device having a touch sensor according to a second embodiment of the present invention. FIG. 6 is a plan view showing the first and second touch electrodes shown in FIG. 5.

The organic light-emitting display device having the touch sensor shown in FIG. 5 has the same constituent components as the organic light-emitting display device having the touch sensor shown in FIG. 3, except that the first and second touch electrodes 152e and 154e, the first and second bridges 152b and 154b, the routing line 160 and the touch pad 170 include opaque conductive films 163. Other modifications are possible. A detailed explanation of the same constituent components will be omitted or will be brief.

The first and second touch electrodes 152e and 154e include, as shown in FIGS. 5 and 6, transparent conductive films 161 and opaque conductive films 163 formed on or under the transparent conductive films 161 in a mesh configuration. The first and second bridges 152b and 154b, the routing line 160 and the touch pad 170 include transparent conductive films 161 and opaque conductive films 163 formed on or under the transparent conductive films 161 in the same pattern as the transparent conductive films 161.

Alternatively, the first and second touch electrodes 152e and 154e can include only opaque conductive films 163 formed in a mesh configuration without transparent conductive films 161, and the first and second bridges 152b and 154b, the routing line 160 and the touch pad 170 can include only opaque conductive films 163 without transparent conductive films 161.

The transparent conductive films 161 are implemented as conductive films having excellent transparency, such as ITO, IZO, IGZO, or silver nanowire (AgNW).

The opaque conductive films 163 are implemented as at least one layered conductive film selected from among Ti, Al, Mo, MoTi, Cu, and Ta so as to have higher conductivity than the transparent conductive films 161. For example, the opaque conductive films 163 are formed in a three-layered stacking structure such as Ti/Al/Ti, MoTi/Cu/MoTi or Ti/Al/Mo. The opaque conductive films 163 compensate for the resistance components of the transparent conductive films 161, thereby improving the conductivity of the first and second touch electrodes 152e and 154e, the first and second bridges 152b and 154b, the routing line 160 and the touch pad 170. In particular, the opaque conductive films 163 serve to reduce the line resistance of the first bridges 152b extending in a convoluted form.

Although the opaque conductive films 163 of the touch electrodes 152e and 154e are illustrated in FIG. 6 as being formed in a mesh structure and having the same density as each other, the opaque conductive films 163 can be formed in a mesh structure so as to have different densities from each other in consideration of the line resistance of the first bridges 152b so that the line resistance of each of the touch-driving lines 152 is uniform. For example, since the length of the first bridge 152b disposed in the first row is the longest, the gap between the opaque conductive films 163 formed in a mesh structure is formed to be the smallest. On the other hand, since the length of the first bridge 152b disposed in the last row is the shortest, the gap between the opaque conductive films 163 formed in a mesh structure is formed to be the largest. In addition, the frequency of the touch-driving signal supplied to the touch-driving lines 152 can be varied in consideration of the line resistance of the first bridges 152b, which extend in a convoluted form. That is, considering the line resistance, which varies depending on the length of the first bridge 152b of each of the touch-driving lines 152, the frequency of the touch-driving signal supplied to the touch-driving lines 152 is varied in a multi-frequency driving manner.

Figure 7A:
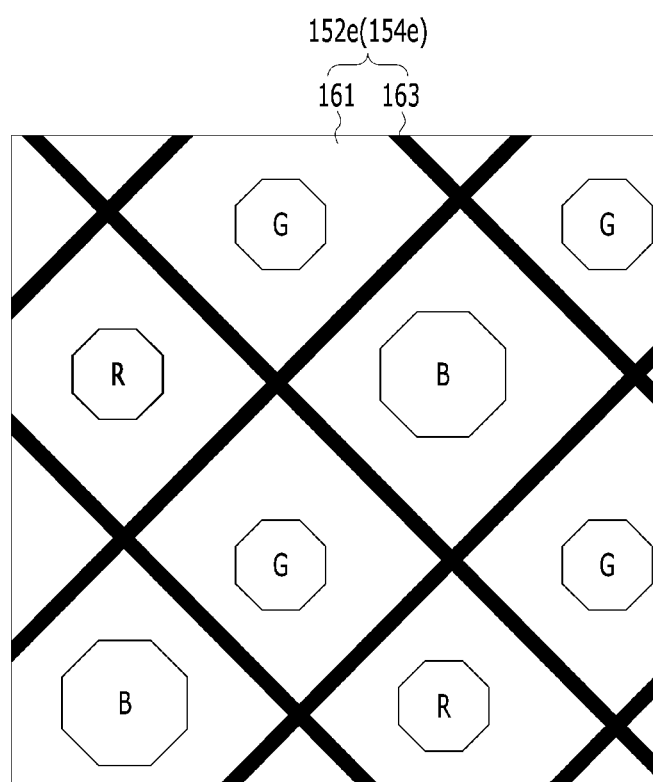
FIG. 7A is a plan view showing the first and second touch electrodes including opaque conductive films shown in FIG. 6 in detail.
Figure 7B:
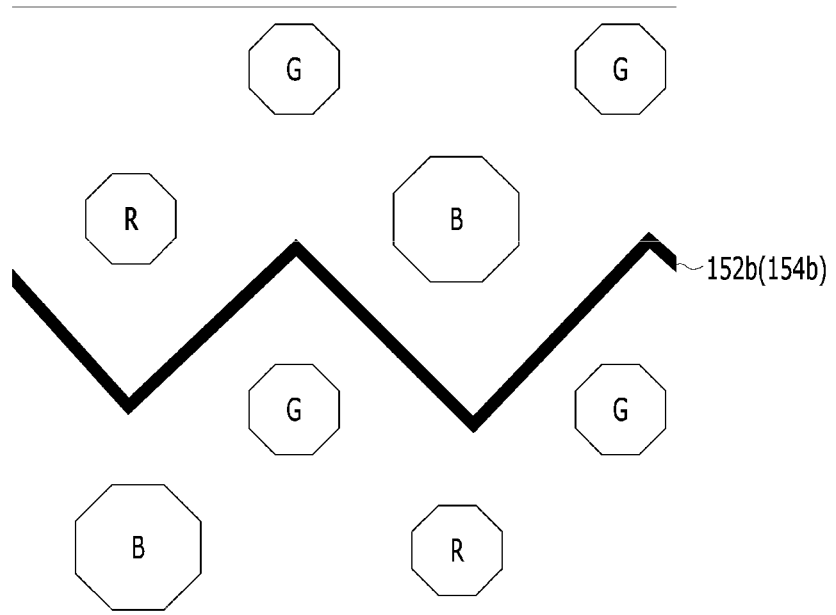
FIG. 7B is a plan view showing the first and second bridges shown in FIG. 6 in detail.

FIG. 7A is a plan view showing the first and second touch electrodes including opaque conductive films shown in FIG. 6 in detail, and FIG. 7B is a plan view showing the first and second bridges shown in FIG. 6 in detail.

As shown in FIGS. 7A and 7B, the opaque conductive films 163 included in the first and second touch electrodes 152e and 154e and the opaque conductive films 163 included in the first and second bridges 152b and 154b are formed so as to overlap the bank 128 but not to overlap the red (R), green (G) and blue (B) light-emitting areas, thereby preventing deterioration in the aperture ratio and the transmittance attributable to the opaque conductive films 163.

As described above, the organic light-emitting display device having the touch sensor according to the second embodiment of the present invention is constructed such that the first and second touch electrodes 152e and 154e and the first and second bridges 152b and 154b are formed to be disposed in the same plane and are formed of the same material as each other. Thus, according to the present invention, the first and second touch electrodes 152e and 154e and the first and second bridges 152b and 154b are formed together through a single mask process, thereby simplifying the structure and the processing thereof.

In addition, the conventional organic light-emitting display device is constructed such that a touch screen is attached to an organic light-emitting display device using an adhesive, whereas the organic light-emitting display device according to the present invention is constructed such that the touch electrodes 152e and 154e are disposed on the encapsulation unit 140 and thus does not require a separate adhesion process, thereby simplifying the processing thereof and reducing costs. In addition, in the organic light-emitting display device having the touch sensor according to the present invention, since the first and second touch electrodes 152e and 154e and the first and second bridges 152b and 154b include the opaque conductive films 163, it is possible to lower the resistance values of the first and second touch electrodes 152e and 154e and the first and second bridges 152b and 154b.

Figure 8:
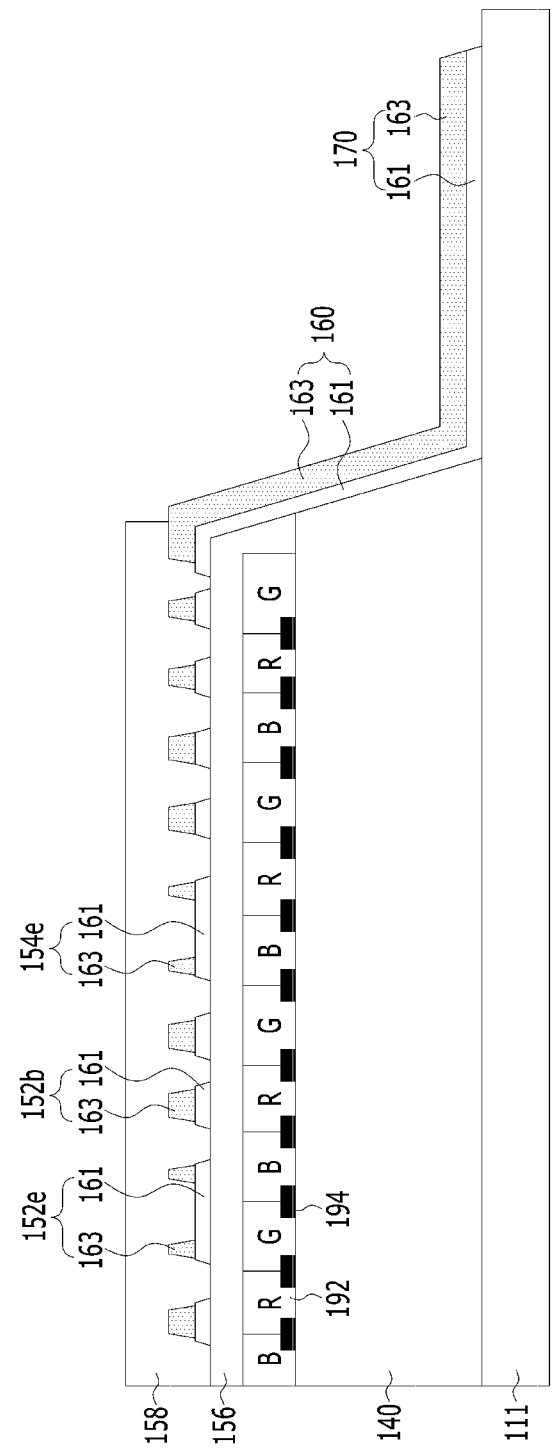
FIG. 8 is a cross-sectional view showing an organic light-emitting display device having a touch sensor according to a third embodiment of the present invention.

FIG. 8 is a cross-sectional view showing an organic light-emitting display device having a touch sensor according to a third embodiment of the present invention.

The organic light-emitting display device having the touch sensor shown in FIG. 8 has the same constituent components as the organic light-emitting display device having the touch sensor shown in FIG. 3, except that a color filter array is further included. Other variations are possible. A detailed explanation of the same constituent components will be omitted or will be brief.

Referring to FIG. 8, the color filter array includes color filters 192 and black matrixes 194 disposed on the second inorganic encapsulation layer 146 of the encapsulation unit 140. The color filters 192 are formed between each of the touch-sensing lines 154 and the touch-driving lines 152 and the encapsulation unit 140. The spacing distance between each of the touch-sensing lines 154 and the touch-driving lines 152 and the light-emitting element 120 is increased by the color filters 192. Thus, the capacity of a parasitic capacitor formed between each of the touch-sensing lines 154 and the touch-driving lines 152 and the light-emitting element 120 can be minimized, thus preventing each of the touch-sensing lines 154 and the touch-driving lines 152 and the light-emitting element 120 from mutually affecting each other due to the coupling therebetween. In addition, the color filters 192 are capable of preventing liquid chemical (developer, etchant or the like), which is used for the manufacture of the touch-sensing lines 154 and the touch-driving lines 152, or external moisture from permeating the light-emitting stack 124. Thus, the color filters 192 are capable of preventing damage to the light-emitting stack 124, which is vulnerable to liquid chemical or moisture.

Each of the black matrixes 194 is disposed between adjacent color filters 192. The black matrixes 194 serve to divide the sub-pixel areas from each other and to prevent optical interference and light leakage between the adjacent sub-pixel areas. The black matrixes 194 are formed of a black insulating material having high resistance, or are formed such that at least two of red (R), green (G) and blue (B) color filters 192 are stacked.

The touch insulating film 156, which is formed of an organic insulating material, is disposed on the substrate 111, on which the color filters 192 and the black matrixes 194 have been formed. The substrate 111, on which the color filters 192 and the black matrixes 194 are formed, is flattened by the touch insulating film 156.

Figure 9:
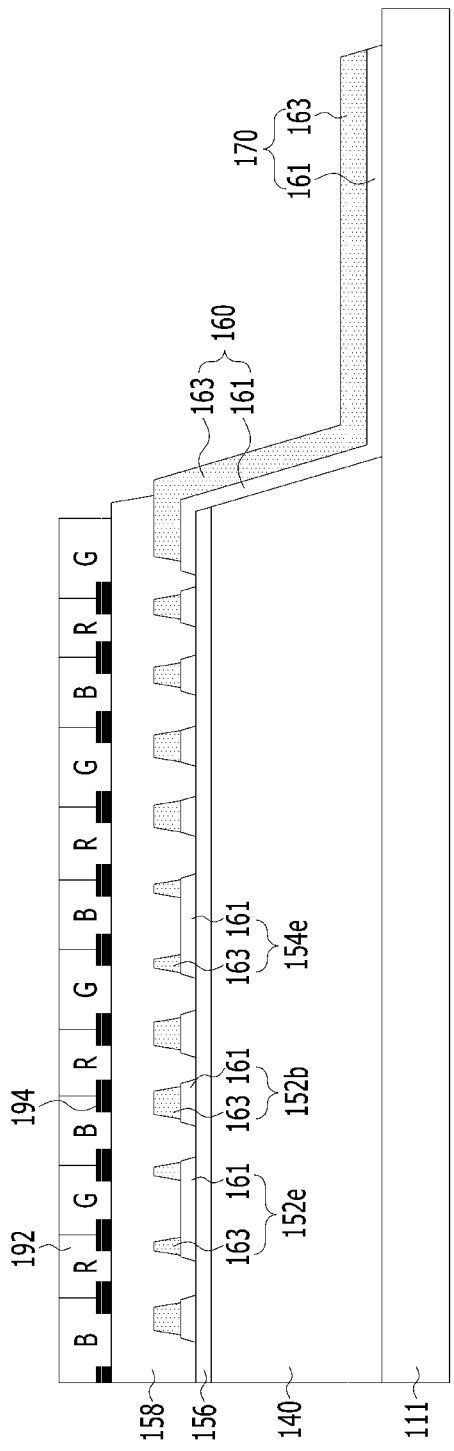
FIG. 9 is a cross-sectional view showing another example of the color filter array shown in FIG. 8.

It is illustrated by way of example in FIG. 8 that the touch electrodes 152e and 154e are disposed on the color filters 192. Alternatively, as shown in FIG. 9, the color filters 192 can be disposed on the touch electrodes 152e and 154e. In this case, the touch electrodes 152e and 154e are disposed between the color filters 192 and the encapsulation unit 140.

Figure 10:
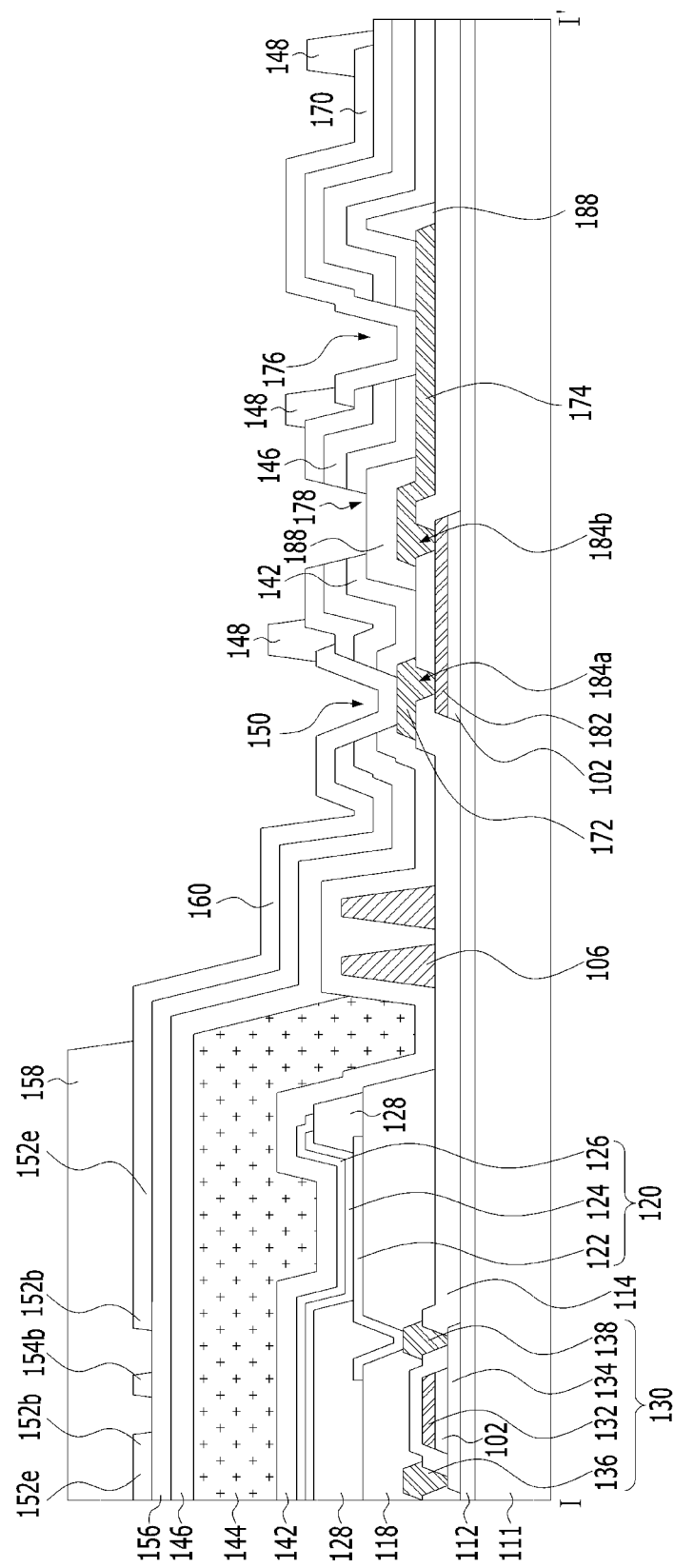
FIG. 10 is a cross-sectional view showing an organic light-emitting display device having a touch sensor according to a fourth embodiment of the present invention.

FIG. 10 is a cross-sectional view showing an organic light-emitting display device having a touch sensor according to a fourth embodiment of the present invention.

The organic light-emitting display device having the touch sensor shown in FIG. 10 has the same constituent components as the organic light-emitting display device having the touch sensor shown in FIG. 3, except that lateral protective films 148 are further included. Other variations are possible. A detailed explanation of the same constituent components will be omitted or will be brief.

The lateral protective films 148 shown in FIG. 10 are formed to cover the lateral surfaces of the routing line 160 and the touch pad 170, which are exposed to the outside, in order to prevent the exposure of the lateral surfaces of the routing line 160 and the touch pad 170. The lateral protective films 148 can prevent an increase in resistance due to defective electrochemical corrosion, which can be caused by exposure of the lateral surfaces of the routing line 160 and the touch pad 170. The lateral protective films 148 are formed together with the touch protective film 158 and are formed of the same material. For example, the lateral protective films 148 are formed in a film or thin-film configuration using an organic insulating material such as epoxy or acrylic, or are formed of an inorganic insulating material such as SiNx or SiOx.

The touch pad 170 is connected to the second upper connection electrode 174 via the pad contact hole 176 between the crack prevention layers 188, and is connected to a signal transmission film in a region between the crack prevention layers 188 and the distal end of the substrate 111. In this case, the flat surface of the touch pad 170 is exposed in the region where the touch pad 170 is connected to the signal transmission film, whereby an increase in unevenness of the surface of the touch pad 170 can be prevented and thus defective connection between the touch pad 170 and the signal transmission film can be prevented.

As described above, the organic light-emitting display device having the touch sensor according to the fourth embodiment of the present invention is constructed such that the first and second touch electrodes 152e and 154e and the first and second bridges 152b and 154b are formed to be disposed in the same plane and are formed of the same material as each other. Thus, according to the present invention, the first and second touch electrodes 152e and 154e and the first and second bridges 152b and 154b are formed together through a single mask process, thereby simplifying the structure and the processing thereof. In addition, the conventional organic light-emitting display device is constructed such that a touch screen is attached to an organic light-emitting display device using an adhesive, whereas the organic light-emitting display device according to the present invention is constructed such that the touch electrodes 152e and 154e are disposed on the encapsulation unit 140 and thus does not require a separate adhesion process, thereby simplifying the processing thereof and reducing costs. In addition, in the organic light-emitting display device having the touch sensor according to the present invention, it is possible to prevent an increase in unevenness of the surface of the touch pad 170 and to prevent defective electrochemical corrosion of the touch pad 170 and the routing line 160 using the lateral protective films 148.

Figure 11:
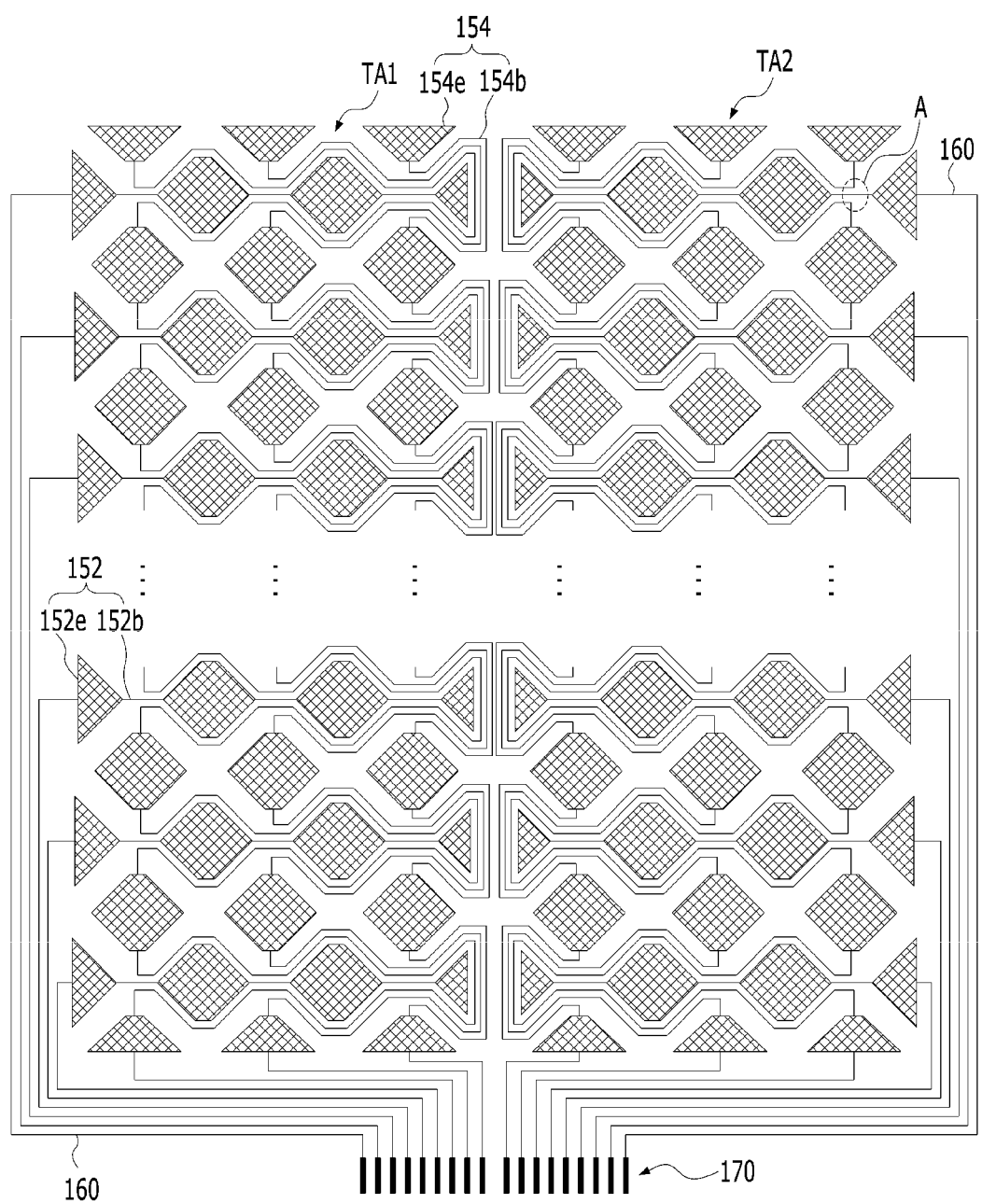
FIG. 11 is a plan view showing the organic light-emitting display device having the touch sensor according to the embodiment(s) of the present invention that is applied to a large-area product.

FIG. 11 is a plan view showing the organic light-emitting display device having the touch sensor according to the embodiment(s) of the present invention that is applied to a large-area product.

As shown in FIG. 11, in the case in which the organic light-emitting display device having the touch sensor is applied to a large-area product, touch areas TA1 and TA2, in each of which a plurality of touch sensors is disposed, can be arranged to be symmetrical in the lateral direction or in the vertical direction.

It is illustrated by way of example in FIG. 2 that the second bridges 154b extend between the second touch electrodes 154e in the second direction, which is the same as the direction in which the second touch electrodes 154e extend, and that the first bridges 152b extend in a convoluted form along the second touch electrodes 154e and the second bridges 154b and are connected to the routing line 160. However, the structures of the first and second bridges 152b and 154b are not limited to the structures shown in FIG. 2. For instance, as shown in FIG. 11, the first bridges 152b can extend between the second bridges 154b in the first direction and can be connected to the other first bridges 152b and the first touch electrodes 152e, which are adjacent thereto in the first direction, and the second bridges 154b can extend in a convoluted form along the first touch electrodes 152e and the first bridges 152b and can be connected to the other second bridges 154b and the second touch electrodes 154e, which are adjacent thereto in the second direction.

Figure 12A:
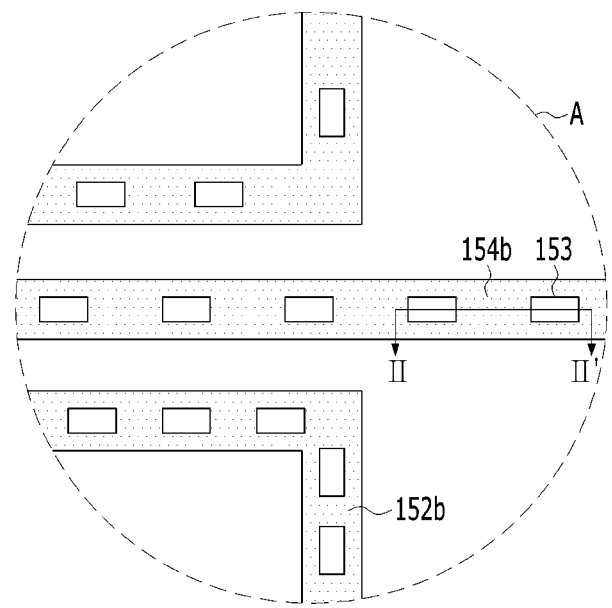
FIG. 12A a plan view showing region A of FIG. 11 in detail.
Figure 12B:
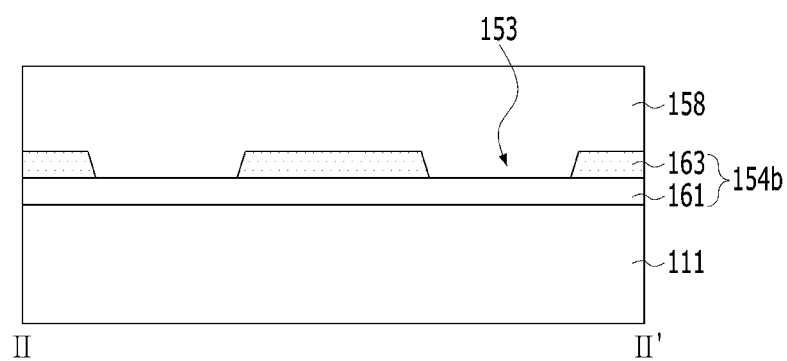
FIGS. 12B and 12C are cross-sectional views taken along line II-IF in FIG. 12A.
Figure 12C:
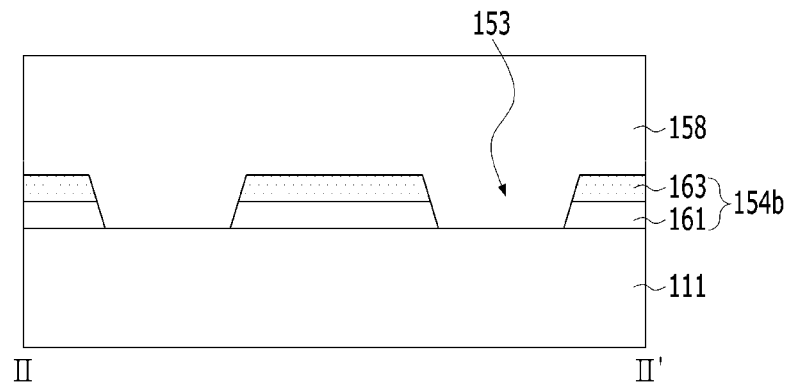

In addition, FIG. 12A a plan view showing region A of FIG. 11 in detail, and FIGS. 12B and 12C are cross-sectional views taken along line II-II' in FIG. 12A.

As shown in FIG. 12A, at least one of the first and second bridges 152b and 154b can have therein a plurality of slits 153. For example, among the first and second bridges 152b and 154b, the bridge extending in a convoluted form is formed to have therein a plurality of slits 153. As shown in FIG. 12B, the slits are formed to penetrate the opaque conductive films 163 of each of the bridges 152b and 154b.

Alternatively, as shown in FIG. 12C, the slits are formed to penetrate the transparent conductive films 161 and the opaque conductive films 163. The bridges 152b and 154b having the slits 153 can be reduced in area compared to bridges having no slits. Thus, reflection of external light by the bridges 152b and 154b can be reduced, thus preventing deterioration in visibility.

Figure 13:
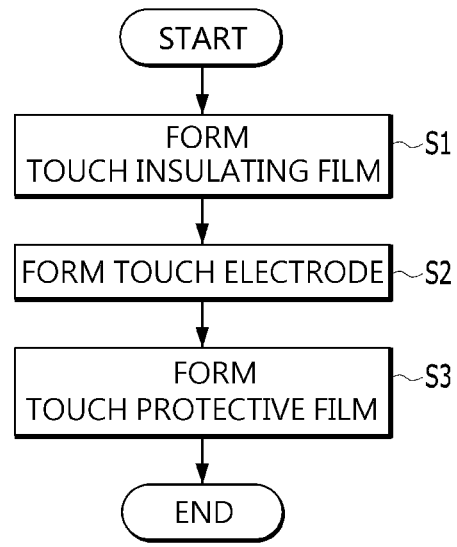
FIG. 13 is a flowchart showing a method of manufacturing an organic light-emitting display device having a touch sensor according to one or more embodiments of the present invention.

FIG. 13 is a flowchart showing a method of manufacturing the organic light-emitting display device having a touch sensor according to one or more embodiments of the present invention. The manufacturing method will be described with reference to the organic light-emitting display device having a touch sensor shown in FIG. 3.

Referring to FIGS. 3 and 13, first, multiple mask processes are carried out to form the driving transistor 130, the lower connection electrode 182, the upper connection electrodes 172 and 174 and the organic light-emitting element 120 on the substrate 111. Subsequently, the first inorganic encapsulation film 142 is formed on the substrate 111, on which the organic light-emitting element 120 has been formed, through a deposition method, such as a chemical vapor deposition (CVD) method, a low-pressure chemical vapor deposition (LPCVD) method or a plasma-enhanced chemical vapor deposition (PECVD) method. Here, the first inorganic encapsulation film 142 is formed of SiOx, SiNx or SiON. Subsequently, a photosensitive or non-photosensitive first organic insulating material is coated on the substrate 111, on which the inorganic encapsulation film 142 has been formed, in order to form the organic encapsulation film 144. Here, the organic encapsulation film 144 is formed of an organic insulating material, such as PCL, acrylic resin, epoxy resin, polyimide, polyethylene or silicon oxycarbide (SiOC). Subsequently, the second inorganic encapsulation film 146 and the touch insulating film 156 are deposited on the entire surface of the substrate 111, on which the organic encapsulation film 144 has been formed. Subsequently, the first and second inorganic encapsulation films 142 and 146 and the touch insulating film 156 are patterned through a photolithography process and an etching process to form the routing contact hole 150, the pad contact hole 176 and the trench 178 (step S1).

Subsequently, a transparent conductive film is deposited on the entire surface of the substrate 111, on which the routing contact hole 150, the pad contact hole 176 and the trench 178 have been formed, and is then patterned through a photolithography process and an etching process to form the first and second touch electrodes 152e and 154e, the first and second bridges 152b and 154b, the routing line 160 and the touch pad 170 (step S2).

The first and second touch electrodes 152e and 154e, the first and second bridges 152b and 154b, the routing line 160 and the touch pad 170, which are shown in FIG. 5, are formed in a manner such that the transparent conductive film 161 and the opaque conductive film 163 are sequentially deposited and are then patterned through photolithography and etching processes using slits or a diffraction mask.

Subsequently, an inorganic insulating material or an organic insulating material is coated on the entire surface of the substrate 111, on which the first and second touch electrodes 152e and 154e, the first and second bridges 152b and 154b, the routing line 160 and the touch pad 170 have been formed, and is then patterned through a photolithography process to form the touch protective film 158 (step S3).

As such, according to the present invention, after the encapsulation unit 140 is formed, the touch insulating film 156 having therein the routing contact hole 150, the pad contact hole 176 and the trench 178 is formed through the first mask process. Subsequently, the touch electrodes 152e and 154e and the bridges 152b and 154b are formed through the single second mask process. Subsequently, the touch protective film 158 is formed through the third mask process. In this case, after the encapsulation unit 140 is formed, a mask process for forming the bridges may be omitted. Therefore, according to the present invention, it is possible to form the touch insulating film 156, the touch sensor and the touch protective film 158 through a reduced number of mask processes (e.g., reduction from the conventional four mask processes to the three mask processes of the present invention), thereby simplifying the processing thereof and reducing costs.

As is apparent from the above description, according to the organic light-emitting display device having a touch sensor in the embodiments of the present invention, since the first and second touch electrodes and the first and second bridges are disposed in the same plane and are formed of the same material, it is possible to form the first and second touch electrodes and the first and second bridges together through a single mask process, thereby simplifying the structure and the processing thereof. In addition, since the touch electrodes are disposed on the encapsulation unit, a separate adhesion process is not required, thus simplifying the processing thereof and reducing costs.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. An organic light-emitting display device comprising:
a light-emitting element disposed on a substrate;
an encapsulation unit disposed on the light-emitting element, the encapsulation unit including a first inorganic encapsulation film on the light-emitting element, a second inorganic encapsulation film on the first inorganic film, and an organic encapsulation film between the first inorganic encapsulation film and the second inorganic encapsulation film;
a touch insulating film disposed on the second inorganic encapsulation film of the encapsulation unit;
a touch sensor disposed on the touch insulating film, and the touch sensor including first touch electrodes arranged on the touch insulating film in a first direction, and second touch electrodes arranged on the touch insulating film in a second direction;
a routing line electrically connected to the touch sensor;
a touch pad electrically connected to the routing line; and
a plurality of connection electrodes electrically connecting the routing line and the touch pad to each other;
wherein the first touch electrodes are connected to each other via first bridges, and the second touch electrodes are connected to each other via second bridges,
wherein the first and second bridges and the first and second touch electrodes are formed of a same material as each other in a same plane, and the first and second bridges and the first and second touch electrodes are disposed on the touch insulating film,
wherein the touch insulating film is disposed on the second inorganic encapsulation film in a non-active area where the touch pad is disposed, and
wherein the touch insulating film and the second inorganic encapsulation film both extend from an active area including the light-emitting element to the non-active area, the second inorganic encapsulation film is disposed between the plurality of connection electrodes and the touch insulating film in the non-active area, and the touch pad is electrically connected to the plurality of connection electrodes exposed through a pad contact hole penetrating the second inorganic encapsulation film and the touch insulating film.

2. The organic light-emitting display device according to claim 1, further comprising;
   a crack prevention layer disposed on the plurality of connection electrodes, the crack prevention layer overlapping the plurality of connection electrodes; and
   a trench penetrating the second inorganic encapsulation film and the touch insulating film to expose the crack prevention layer.

3. The organic light-emitting display device according to claim 1, wherein the first bridges extend in a convoluted form along the second bridges and the second touch electrodes, and are connected to first bridges and first touch electrodes disposed adjacent thereto in the first direction, and
   wherein the second bridges are disposed between the first bridges, and are connected to second bridges and second touch electrodes disposed adjacent thereto in the second direction.

4. The organic light-emitting display device according to claim 1, wherein the first bridges are disposed between the second bridges, and are connected to first bridges and first touch electrodes disposed adjacent thereto in the first direction, and
   wherein the second bridges extend in a convoluted form along the first bridges and the first touch electrodes, and are connected to second bridges and second touch electrodes disposed adjacent thereto in the second direction.

5. The organic light-emitting display device according to claim 1, wherein the routing line is disposed on a lateral surface of the encapsulation unit; and
   wherein the touch pad is disposed on the touch insulating film.

6. The organic light-emitting display device according to claim 5, wherein each of the first and second touch electrodes comprises:
   an opaque conductive film formed in a mesh structure; and
   a transparent conductive film disposed on or under the opaque conductive film,
   wherein each of the first and second bridges, the routing line and the touch pad comprises:
   an opaque conductive film; and
   a transparent conductive film disposed on or under the opaque conductive film in a same pattern as the opaque conductive film,
   wherein the transparent conductive film is formed of a material selected from among ITO, IZO, IGZO, and silver nanowire (AgNW), and
   wherein the opaque conductive film is formed of at least one material of Al, Ti, Cu, or Mo, and has a single-layer or multi-layer structure.

7. The organic light-emitting display device according to claim 6, wherein the opaque conductive film of each of the first and second touch electrodes and the first and second bridges is disposed at a position corresponding to a bank forming a light-emitting area of the light-emitting element.

8. The organic light-emitting display device according to claim 5, further comprising:
   a lateral protective film covering a lateral surface of the touch pad.

9. The organic light-emitting display device according to claim 8, further comprising:
   a touch protective film exposing the routing line and the touch pad, the touch protective film overlapping the touch sensor,
   wherein the lateral protective film and the touch protective film are formed of a same material.

10. The organic light-emitting display device according to claim 5, wherein the substrate comprises a bending area and is formed of a flexible material, and
    wherein the plurality of connection electrodes are disposed in the bending area.

11. The organic light-emitting display device according to claim 1, further comprising:
    color filters disposed on or under the touch sensor; and
    black matrixes disposed between the color filters.

12. The organic light-emitting display device according to claim 1, wherein at least one of the first bridges or the second bridges has therein a plurality of slits.

13. The organic light-emitting display device according to claim 1, wherein the first and second directions are substantially perpendicular to each other.

14. An organic light-emitting display device comprising:
    a light-emitting element disposed on a substrate;
    an encapsulation unit disposed on the light-emitting element, the encapsulation unit including a first inorganic encapsulation film on the light-emitting element, a second inorganic encapsulation film on the first inorganic film, and an organic encapsulation film between the first inorganic encapsulation film and the second inorganic encapsulation film;
    a touch insulating film disposed on the second inorganic encapsulation film of the encapsulation unit;
    a touch sensor disposed on the touch insulating film, and the touch sensor including first touch electrodes arranged on the touch insulating film in a first direction, and second touch electrodes arranged on the touch insulating film in a second direction;
    a routing line electrically connected to the touch sensor;
    a touch pad electrically connected to the routing line; and
    a plurality of connection electrodes electrically connecting the routing line and the touch pad to each other;
    wherein the first touch electrodes are connected to each other via first bridges, and the second touch electrodes are connected to each other via second bridges,
    wherein the first and second bridges and the first and second touch electrodes are formed of a same material as each other in a same plane, and the first and second bridges and the first and second touch electrodes are disposed on the touch insulating film,
    wherein the touch insulating film is disposed on the second inorganic encapsulation film in a non-active area where the touch pad is disposed,
    wherein the touch pad is electrically connected to the plurality of connection electrodes exposed through a pad contact hole penetrating the second inorganic encapsulation film and the touch insulating film, and
    wherein the non-active area includes a trench penetrating the second inorganic encapsulation film and the touch insulating film, and the trench is disposed in an area between the light-emitting element and the pad contact hole.

15. An organic light-emitting display device comprising:
a light-emitting element disposed on a substrate;
an encapsulation unit disposed on the light-emitting element, the encapsulation unit including a first inorganic encapsulation film on the light-emitting element, a second inorganic encapsulation film on the first inorganic film, and an organic encapsulation film between the first inorganic encapsulation film and the second inorganic encapsulation film;
a touch insulating film disposed on the second inorganic encapsulation film of the encapsulation unit;
a touch sensor disposed on the touch insulating film, and the touch sensor including first touch electrodes arranged on the touch insulating film in a first direction, and second touch electrodes arranged on the touch insulating film in a second direction;
a routing line electrically connected to the touch sensor;
a touch pad electrically connected to the routing line; and
a plurality of connection electrodes electrically connecting the routing line and the touch pad to each other;
wherein the first touch electrodes are connected to each other via first bridges, and the second touch electrodes are connected to each other via second bridges,
wherein the first and second bridges and the first and second touch electrodes are formed of a same material as each other in a same plane, and the first and second bridges and the first and second touch electrodes are disposed on the touch insulating film,
wherein the touch insulating film is disposed on the second inorganic encapsulation film in a non-active area where the touch pad is disposed,
wherein the touch pad is electrically connected to the plurality of connection electrodes exposed through a pad contact hole penetrating the second inorganic encapsulation film and the touch insulating film, and
wherein the non-active area includes a crack prevention layer disposed on the plurality of connection electrodes, and the crack prevention layer is disposed in an area between the light-emitting element and the pad contact hole.

* * * * *